United States Patent
Spina et al.

(10) Patent No.: US 12,081,253 B2
(45) Date of Patent: *Sep. 3, 2024

(54) DIGITAL SELF-CALIBRATION FOR AUTOMATIC OFFSET CANCELLATION

(71) Applicant: STMicroelectronics S.r.l., Agrate Brianza (IT)

(72) Inventors: Nunzio Spina, Catania (IT); Giuseppe Palmisano, S. Giovanni la Punta (IT); Alessandro Castorina, Acireale (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 18/352,424

(22) Filed: Jul. 14, 2023

(65) Prior Publication Data
US 2023/0361796 A1 Nov. 9, 2023

Related U.S. Application Data

(63) Continuation of application No. 17/457,496, filed on Dec. 3, 2021, now Pat. No. 11,750,234.

(51) Int. Cl.
| | |
|---|---|
| *H04B 1/16* | (2006.01) |
| *H03F 3/19* | (2006.01) |
| *H03F 3/24* | (2006.01) |
| *H04L 27/06* | (2006.01) |

(52) U.S. Cl.
CPC ............ *H04B 1/16* (2013.01); *H03F 3/19* (2013.01); *H03F 3/245* (2013.01); *H04L 27/06* (2013.01); *H03F 2200/451* (2013.01)

(58) Field of Classification Search
CPC ... H03B 1/16; H03F 3/19; H03F 3/245; H03F 2200/451; H04L 27/06
See application file for complete search history.

(56) References Cited

U.S. PATENT DOCUMENTS

| 11,750,234 B2 * | 9/2023 | Spina ................. H03F 3/245 |
| | | 329/347 |
| 2017/0257068 A1 | 9/2017 | Hur et al. |
| 2020/0336122 A1 | 10/2020 | Lin et al. |

\* cited by examiner

*Primary Examiner* — Jeffrey M Shin
(74) *Attorney, Agent, or Firm* — Slater Matsil, LLP

(57) ABSTRACT

A method for calibrating the DC operating point of a PWM receiver circuit is disclosed. The PWM receiving circuit includes an envelope detector having a first resistor string, and includes a bias circuit having a second resistor string and a plurality of switches. The second resistor string is coupled between a supply voltage and a reference voltage and functions as a voltage divider. Each switch, when closed, accesses a second voltage at a node of the second resistor string connected to the closed switch. To perform the calibration process, the plurality of switches is closed one at a time, and the second voltage is compared with a first voltage at a first node of the first resistor string. The switch that, when closed, produces the smallest difference between the first voltage and the second voltage remains closed after the calibration process, and is used for demodulating the PWM signal.

20 Claims, 11 Drawing Sheets

1000

1010 — measure a voltage difference between a first node of the receiver circuit and a second node of the receiver circuit, wherein the receiver circuit comprises:

an envelope detector configured to detect an envelope of an input signal of the receive circuit, wherein the envelope detector comprises a first resistor string coupled to a first transistor and a second transistor that are coupled in parallel, wherein the first resistor string comprises first resistors coupled in series and second resistors coupled in series, with the first resistors and the second resistors connected at the second node;

a bias circuit configured to provide a reference voltage, wherein the bias circuit comprises a second resistor string coupled to a third transistor, wherein the second resistor string comprises third resistors coupled in series and fourth resistors coupled in series, with the third resistors and the fourth resistors connected at a third node;

a plurality of switches coupled in parallel, wherein the plurality of switches comprise first switches, second switches, and a third switch, wherein each of the first switches is coupled between the first node and a first terminal of a respective one of the third resistors distal from the third node, wherein each of the second switches is coupled between the first node and a second terminal of a respective one of the fourth resistors distal from the third node, and wherein the third switch is coupled between the first node and the third node; and an amplifier, wherein a first input terminal of the amplifier is coupled to the first node, and a second input terminal of the amplifier is coupled to the second node, wherein the voltage difference is generated at an output terminal of the amplifier 1020 — open the plurality of switches 1030 — after opening the plurality of switches, close the third switch

DIGITAL SELF-CALIBRATION FOR AUTOMATIC OFFSET CANCELLATION

PRIORITY CLAIM AND CROSS-REFERENCE

This application is a continuation of U.S. patent application Ser. No. 17/457,496, entitled "Digital Self-Calibration for Automatic Offset Cancellation," filed on Dec. 3, 2021, which application is incorporated herein by reference.

TECHNICAL FIELD

The present invention relates generally to electronic circuits, and, in particular embodiments, to a circuit for automatic offset cancellation.

BACKGROUND

Receiver circuits are widely used in electric devices for communication purpose. In a typical receiver circuit, the received signal goes through front-end processing, such as filtering and/or amplification, before being digitized into digital data for further processing to recover the transmitted data. In some receiver circuits, the input signals to the analog amplifier include a signal voltage and a reference voltage, and the voltage difference between the signal voltage and the reference voltage is amplified and digitized for processing. The signal voltage and the reference voltage are generated by circuits designed with components having respective nominal values (e.g., nominal resistance values). However, the actual values of the electrical components in the circuits may deviate from their nominal values, which may cause an offset in the voltage difference. Due to the high gain of the analog amplifier, a small offset in the voltage difference at the input of the amplifier may result in a large voltage shift at the output of the amplifier, which may cause error in the subsequent demodulation or decoding process.

Calibration processes may be performed to remove or reduce the offset. However, typical calibration processes are performed manually, e.g., at the manufacturing facility, which is time consuming and costly. In addition, once the electric device is deployed in the field, factors such as component aging and temperature variation may change the receiver circuit characteristics, which may require additional calibration. There is a need in the aft for calibration processes that can be performed automatically (e.g., without human operator intervention) and on-demand in the field, such that receiver performance is maintained throughput the lifespan of the electric device.

SUMMARY

In some embodiments, a receiver circuit includes: a first resistor string comprising a plurality of resistors coupled in series; a second resistor string comprising a plurality of resistors coupled in series; a first transistor and a second transistor coupled in parallel, wherein a first load path terminal of the first transistor and a first load path terminal of the second transistor are coupled to a reference voltage node, wherein a second load path terminal of the first transistor and a second load path terminal of the second transistor are coupled to a first end of the first resistor string, with a second end of the first resistor string being coupled to a supply voltage node, wherein a first control terminal of the first transistor and a second control terminal of the second transistor are coupled to a first input terminal of the receiver circuit and a second input terminal of the receiver circuit, respectively; a third transistor, wherein a first load path terminal of the third transistor is coupled to the reference voltage node, and a second load path terminal of the third transistor is coupled to a first end of the second resistor string, with a second end of the second resistor string being coupled to the supply voltage node, wherein a control terminal of the third transistor is coupled to a bias voltage node; a plurality of switches coupled in parallel, wherein each switch of the plurality of switches has a first terminal and a second terminal, wherein the first terminals of the plurality of switches are coupled to a first node, wherein the second terminal of each switch is coupled to a terminal of a respective resistor in the second resistor string; and an amplifier, wherein a first input terminal of the amplifier is coupled to the first node, and a second input terminal of the amplifier is coupled to a second node in the first resistor string.

In some embodiments, a circuit for demodulating an on-off keying (OOK) modulated pulse-width modulation (PWM) signal includes: an envelope detector configured to detect an envelope of the OOK modulated PWM signal, comprising: a first resistor string comprising resistors coupled in series; and a first transistor and a second transistor coupled in parallel between a first end of the first resistor string and a reference voltage node, wherein a second end of the first resistor string is coupled to a supply voltage node; a bias circuit configured to provide a reference voltage, comprising: a second resistor string comprising resistors coupled in series; and a third transistor coupled between a first end of the second resistor string and the reference voltage node, wherein a second end of the second resistor string is coupled to the supply voltage node; a plurality of switches coupled in parallel, wherein each switch of the plurality of switches has a first terminal and a second terminal, wherein the first terminal of each switch is coupled to a first node, and the second terminal of each switch is coupled to a terminal of a respective resistor in the second resistor string; an amplifier, wherein a first input terminal of the amplifier is coupled to the first node, and a second input terminal of the amplifier is coupled to a second node in the first resistor string; and a comparator coupled to an output terminal of the amplifier.

In some embodiments, a method of calibrating a receiver circuit includes: measuring a voltage difference between a first node of the receiver circuit and a second node of the receiver circuit, wherein the receiver circuit comprises: an envelope detector configured to detect an envelope of an input signal of the receive circuit, wherein the envelope detector comprises a first resistor string coupled to a first transistor and a second transistor that are coupled in parallel, wherein the first resistor string comprises first resistors coupled in series and second resistors coupled in series, with the first resistors and the second resistors connected at the second node; a bias circuit configured to provide a reference voltage, wherein the bias circuit comprises a second resistor string coupled to a third transistor, wherein the second resistor string comprises third resistors coupled in series and fourth resistors coupled in series, with the third resistors and the fourth resistors connected at a third node; a plurality of switches coupled in parallel, wherein the plurality of switches comprise first switches, second switches, and a third switch, wherein each of the first switches is coupled between the first node and a first terminal of a respective one of the third resistors distal from the third node, wherein each of the second switches is coupled between the first node and a second terminal of a respective one of the fourth resistors distal from the third node, and wherein the third switch is coupled between the first node and the third node; and an amplifier, wherein a first input terminal of the amplifier is coupled to the first node, and a second input terminal of the amplifier is coupled to the second node, wherein the voltage difference is generated at an output terminal of the amplifier; opening the plurality of switches; after opening the plurality of switches, closing the third switch; after closing the third switch, choosing a set of switches from the plurality of switches based on a sign of the voltage difference, wherein the set of switches are the first switches if the sign is positive, or the second switches if the sign is negative; closing the set of switches one at a time along a first direction from the third switch toward a last switch of the set of switches distal from the third switch while the sign remains unchanged; and stopping calibrating the receiver circuit when the sign changes.

BRIEF DESCRIPTION OF THE DRAWINGS

The details of one or more embodiments of the invention are set forth in the accompanying drawings and the description below. Other features, objects, and advantages of the invention will be apparent from the description and drawings, and from the claims. In the figures, identical reference symbols generally designate the same component parts throughout the various views, which will generally not be re-described in the interest of brevity. For a more complete understanding of the invention, reference is now made to the following descriptions taken in conjunction with the accompanying drawings, in which:

FIGS. 10A and 10B together illustrate a flow chart of a method of calibrating a receiver circuit, in an embodiment.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to example embodiments in a specific context, namely a receiver circuit with an offset cancellation circuit for automatic calibration of the DC operating point of the receiver circuit.

Figure 1:
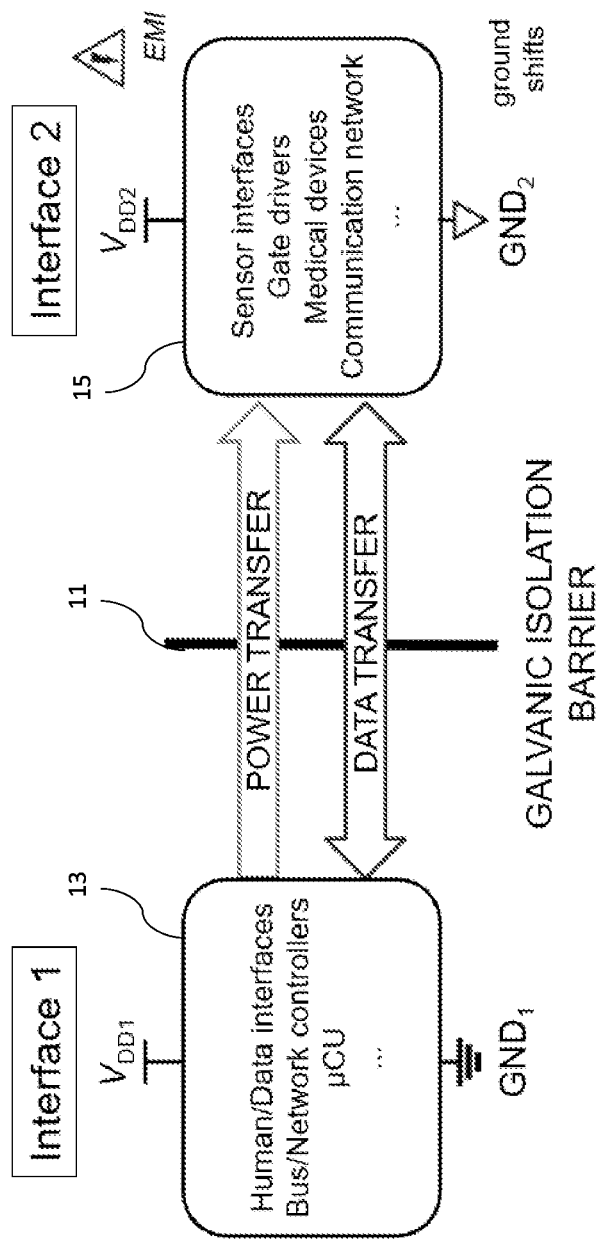
FIG. 1 illustrates a block diagram of a system with galvanic isolation, in an embodiment.

FIG. 1 illustrates a block diagram of an electrical system with galvanic isolation, in an embodiment. The electrical system in FIG. 1 includes a first circuit 13 with a first supply voltage (e.g., $V_{DD1}$) and a first electrical ground level (e.g., $GND_1$), a second circuit 15 with a second supply voltage (e.g., $V_{DD2}$) and a second electrical ground level (e.g., $GND_2$), and an isolation barrier 11 in between. Galvanic isolation is used in electrical systems for isolating functional sections of the electrical systems to prevent current flow between the isolated functional sections. Energy or information can still be exchanged between the sections by other means, such as capacitance, induction, or electromagnetic waves, or by optical, acoustic or mechanical means. Galvanic isolation may be used where two or more electric circuits need to communicate with each other, but their grounds may be at different potentials. Galvanic isolation may also be used for safety purposes. For example, optocouplers may be used within an electrical system to decouple a function block from another block connected to the power grid or other high voltage, for safety and equipment protection. As another example, power semiconductors connected to the line voltage may be switched by optocouplers driven from low-voltage circuits, which need not be insulated for the higher line voltage.

Figure 2:
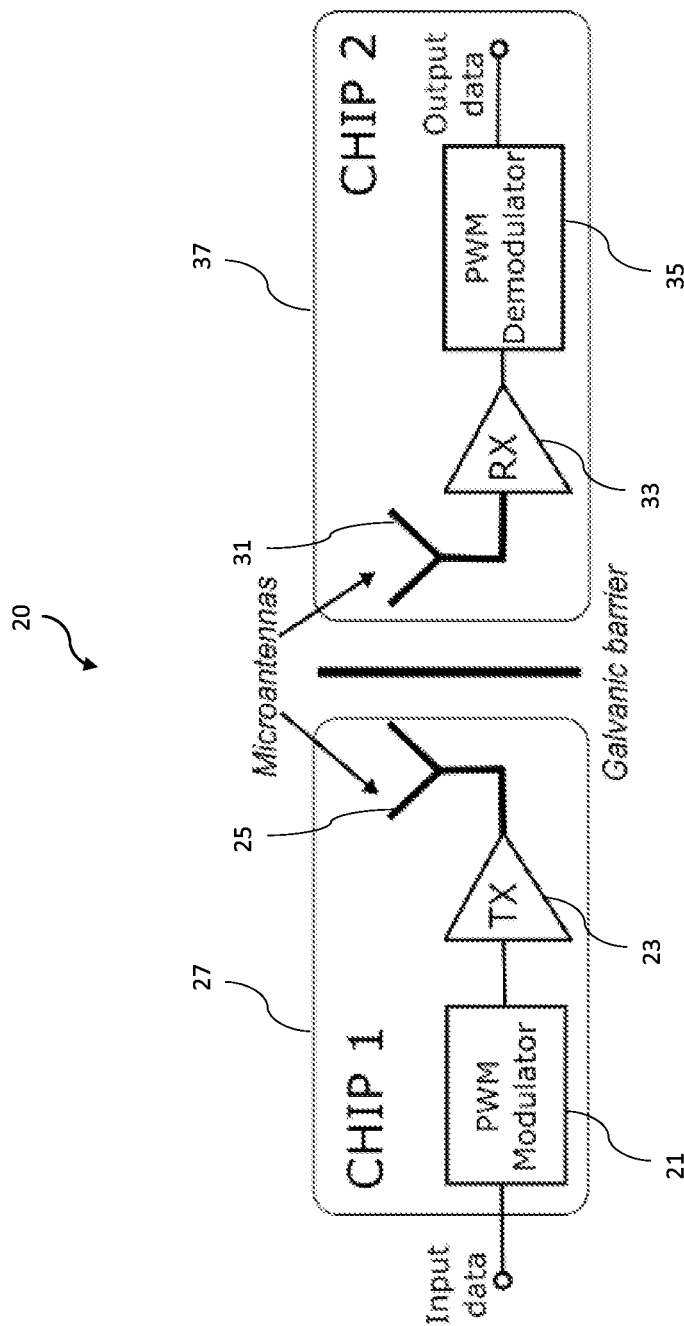
FIG. 2 illustrates a block diagram of a communication system with galvanic isolation, in an embodiment.

FIG. 2 illustrates a block diagram of a communication system 20 with galvanic isolation, in an embodiment. The communication system 20 in FIG. 2 includes a semiconductor chip 27 and a semiconductor chip 37. The semiconductor chip 27 includes a modulator 21 (e.g., a PWM modulator) for modulating an input data signal, a transmit (Tx) circuit 23 which may include digital-to-analog converters (DACs), amplifiers, filters, or the like, and an antenna 25 (e.g., a micro-antenna) for transmitting the modulated radio frequency (RF) signals. The semiconductor chip 37 includes an antenna 31 (e.g., a micro-antenna) for receiving the transmitted RF signal from the antenna 25. The semiconductor chip 37 further includes a receive (Rx) circuit 33 which may include filters, amplifiers, analog-to-digital converters (ADCs), or the like, and a demodulator 35 (e.g., a PWM demodulator) for demodulating the received signal digital. The semiconductor chip 27 and the semiconductor chip 37 may be placed next to each other in a same electric device, e.g., in a motor control device. The galvanic isolation between the semiconductor chip 27 and the semiconductor chip 37 is achieved by the molding compound of the package separating the semiconductor chips (e.g., 27 and 37), and by maintaining a suitable spacing from the lead frame on which the semiconductor chips are glued. The transmission of RF signals between the semiconductor chips is achieved through the electromagnetic coupling between the antennas 25 and 31.

Figure 3:
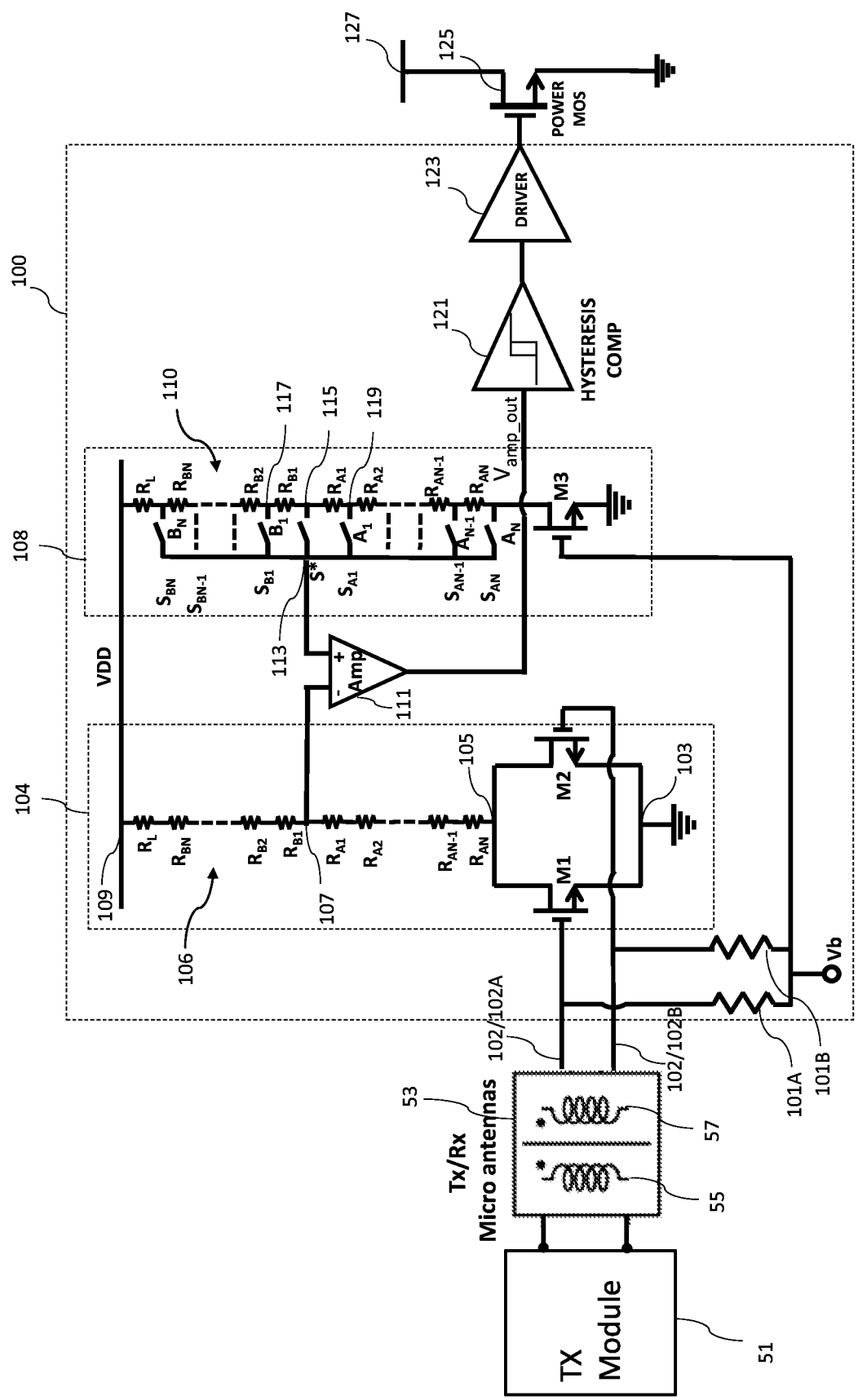
FIG. 3 illustrates a schematic diagram of a receiver circuit with self-calibration capability, in an embodiment.

FIG. 3 illustrates a schematic diagram of a receiver circuit 100 with self-calibration capability, in an embodiment. Note that for simplicity, not all features of the receiver circuit 100 are illustrated in FIG. 3. In addition, FIG. 3 shows the connection or coupling between the receiver circuit 100 and other devices (e.g., 51, 55, 57, and 125), where the other devices may not be a part of the receiver circuit 100.

Referring to FIG. 3, the receiver circuit 100 includes input terminals 102 (e.g., 102A and 102B) for receiving input signals. The input terminals 102A and 102B are coupled to a bias voltage node Vb through coupling resistors 101A and 101B, respectively. The bias voltage node Vb is configured to accept a bias voltage. In some embodiments, the coupling resistors 101A and 101B have a same nominal resistance value. In the discussion herein, "coupled" is used to refer electrical coupling unless otherwise specified, and the term "coupled" is used to describe situations where a first electrical component is directly, or indirectly, coupled to a second electrical component, while "directly coupled" is used to describe a direct electrical connection (e.g., via a copper line) between a first electrical component and a second electrical component without an intervening electrical component.

In the example of FIG. 3 the box 53 shows the galvanic isolation between a Tx module 51 and the receiver circuit 100. In particular, the box 53 shows a primary winding 55 electromagnetically coupled to a secondary winding 57 as a non-limiting example of galvanic isolation. One skilled in the art will readily appreciate that besides coils, other coupling methods, such as through micro-antennas (see, e.g., 25 and 31 in FIG. 2), are also possible and are fully intended to be included within the scope of the present disclosure. The Tx module 51 in FIG. 3 may correspond to, e.g., the modulator 21 and the Tx circuit 23 in FIG. 2, as an example.

Figure 4:
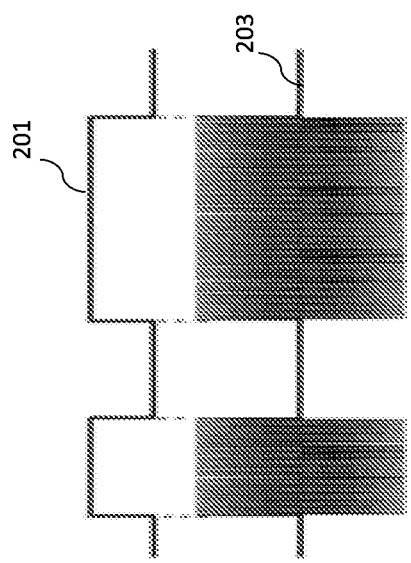
FIG. 4 illustrates an on-off keying (OOK) modulated pulse-width modulation (PWM) signal, in another embodiment.

In the example of FIG. 3, the signal arriving at the input terminals 102 is an OOK modulated PWM signal, which is illustrated in FIG. 4. Referring temporarily to FIG. 4, which shows a PWM signal 201 and an OOK modulated PWM signal 203. The OOK modulated PWM signal 203 is generated by modulating a high-frequency RF signal by the PWM signal 201, such that during time periods when the PWM signal 201 is logic high, the high-frequency RF signal (e.g., a high-frequency sinusoid signal) is transmitted, and during time periods when the PWM signal 201 is logic low, the high-frequency RF signal is not transmitted and the signal 203 stays at logic low.

Referring back to FIG. 3, the receiver circuit 100 further includes an envelope detector 104 (also referred to as an envelope detector circuit), a bias circuit 108, an amplifier 111, a comparator 121, and a driver circuit 123. The envelope detector 104 is configured to detect the envelope of the received signal. In the example of FIG. 3, the envelope detector 104 includes a transistor M1 and a transistor M2 coupled in parallel between a node 105 and a reference voltage node 103 (e.g., electrical ground). The transistors M1 and M2 may be any suitable type of transistors, such as metal-oxide-semiconductor field-effect transistors (MOSFETs), bipolar junction transistors (BJTs), or the like. As illustrated in FIG. 3, a first load path terminal (e.g., a drain terminal of a MOSFET, or a collector terminal of a BJT) of the transistor M1 and a first load path terminal (e.g., a drain terminal of a MOSFET, or a collector terminal of a BJT) of the transistor M2 are coupled to the node 105. A second load path terminal (e.g., a source terminal of a MOSFET, or an emitter terminal of a BJT) of the transistor M1 and a second load path terminal (e.g., a source terminal of a MOSFET, or an emitter terminal of a BJT) of the transistor M2 are coupled to the reference voltage node 103. A control terminal (e.g., a gate terminal of a MOSFET, or a base terminal of a BJT) of the transistor M1 is coupled to the input terminal 102A, and a control terminal (e.g., a gate terminal of a MOSFET, or a base terminal of a BJT) of the transistor M2 is coupled to the input terminal 102B.

The envelope detector 104 further include a resistor string 106, which includes a plurality of resistors, such as resistor $R_{An}$, resistors $R_{Bn}$, and a resistor $R_1$, where n=1, 2, . . . , N. A first end (e.g., the lower end in FIG. 3) of the resistor string 106 is coupled to the node 105, and a second end (e.g., the upper end in FIG. 3) of the resistor string 106 is coupled to a supply voltage node 109, which is configured to be coupled to a supply voltage $V_{DD}$.

In the illustrated embodiment, the resistors $R_{An}$ and the resistors $R_{Bn}$ have a same number (e.g., N) of resistors, and the electrical resistances (also referred to as resistances) of the resistors $R_{An}$ and $R_{Bn}$ are substantially the same (also referred to as nominally the same). In the discussion herein, when the phrase "substantially the same" (or "nominally the same") is used to describe components, it means that the components are manufactured to have the same nominal value or have the same nominal physical/electrical characteristics. One skilled in the art will readily appreciate that due to process variations during manufacturing, even components manufactured in the same batch may actually be slightly different from each other. For example, the resistors $R_{An}$ and the resistors $R_{Bn}$ (n=1, 2, . . . , N) have the same nominal resistance value R, but the actual resistance values may deviate from the nominal resistance value R by, e.g., less than 5%, or less than 10%, depending on, e.g., the process control during manufacturing. In the example of FIG. 3, the resistors $R_{An}$ and the resistors $R_{Bn}$ have the same number (e.g., N) of resistors. In other embodiments, the resistors $R_{An}$ and the resistors $R_{Bn}$ may have different number of resistors. These and other variations are fully intended to be included within the scope of the present disclosure. Depending on factors such as the biasing current and the amplitude of the voltage correction to be performed, the resistance (e.g., nominal value) of the resistors $R_{An}$ and the resistors $R_{Bn}$ may be between 250Ω and 1.25 KΩ, such as 750Ω, and the resistance of the resistor $R_L$ may be between 20 KΩ, and 100 K Ω, such as 60 K Ω, as an example.

Still referring to FIG. 3, the bias circuit 108 is configured to provide a reference voltage. In the example of FIG. 3, the bias circuit 108 includes a transistor M3 coupled between a first end (e.g., the lower end in FIG. 3) of a resistor string 110 and the reference voltage node (e.g., electrical ground). A second end (e.g., the higher end in FIG. 3) of the resistor string 110 is coupled to the supply voltage node 109.

In the illustrated embodiment, the resistor string 110 is substantially the same as the resistor string 106. In other words, the resistor string 110 includes the resistors $R_{An}$, the resistors $R_{Bn}$, and the resistor $R_L$, where n=1, 2, . . . , N, same as the resistor string 106. In some embodiments, the value N is the number of correction steps used to correct the voltage offset, details of which are discussed hereinafter. For example, a possible implementation may use 15 correction steps (e.g., N=15). Due to, e.g., process variations during manufacturing, corresponding resistors in the resistor strings 110 and 106 may have slightly different resistance values.

The difference between a reference voltage at a node 115 of the resistor string 110 and a signal voltage at a node 107 of the resistor string 106 is amplified by the amplifier 111. The output of the amplifier 111 is sent to a comparator 121, which may be a hysteresis comparator. The output of the comparator 121 is the demodulated PWM signal. The output of the comparator 121 is sent to the driver circuit 123, which drives, e.g., a power switch 125 coupled between a supply voltage node 127 and a reference voltage node (e.g., electrical ground). The power switch 125 may be, e.g., a power switch (e.g., a power MOSFET) in a power converter (e.g., buck converter, boost converter, or the like).

Figure 5:
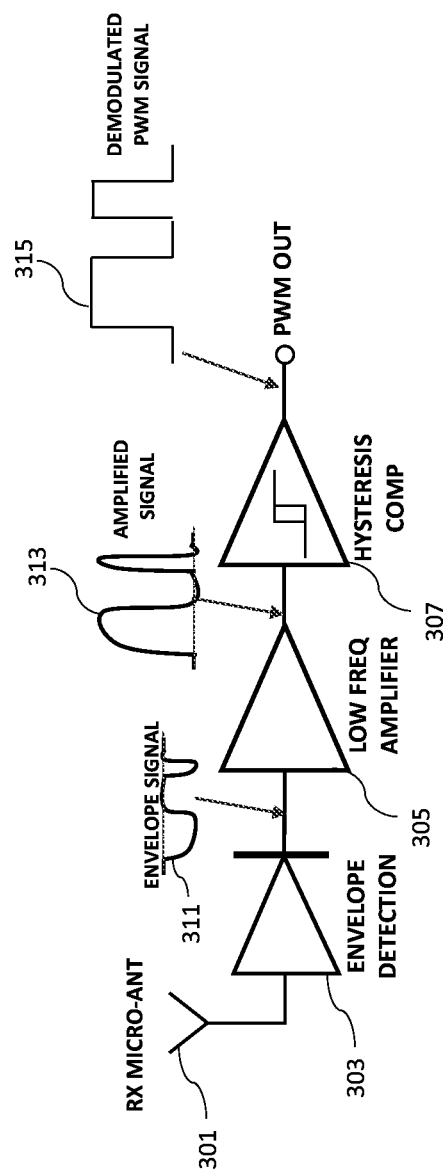
FIG. 5 is a block diagram illustrating the signal processing in the receiver circuit of FIG. 3, in an embodiment.

FIG. 5 is a block diagram illustrating the signal processing in the receiver circuit 100 of FIG. 3, in an embodiment. Referring temporarily to FIG. 5, the RF signal received by the antenna 301 (e.g., a micro-antenna) is sent to an envelope detector 303 to generate the envelope signal 311. The envelope detector 303 may correspond to the envelope detector 104 in FIG. 3. The output of the envelope detector 303 (e.g., the envelope signal 311) is sent to an amplifier 305, which may correspond to the amplifier 111 in FIG. 3. The amplifier 305 amplifies the difference between a reference voltage (e.g., a zero voltage) and the envelope signal 311 to generate, at an output of the amplifier 305, an amplified signal 313. The amplified signal 313 is sent to a hysteresis comparator 307, which may correspond to the comparator 121 in FIG. 3. The output of the hysteresis comparator 307 is the demodulated PWM signal 315.

Referring back to FIG. 3, in an ideal situation, the resistor string 106 and the resistor string 110 are matched (e.g., the same), and the transistors M1, M2, and M3 are matched (e.g., the same), in which case the input voltages to the amplifier 111 are the voltage at the node 107 (which is the node between the resistors $R_{An}$ and the resistor $R_{Bn}$ in the resistor string 106) and the voltage at the node 115 (which is the node between the resistors $R_{An}$ and the resistor $R_{Bn}$ in the resistor string no). When there is no received RF signal at the input terminals 102, or when the OOK modulated PWM signal has a zero value, the voltages at the nodes 107 and 115 should ideally be the same, resulting in a zero voltage at the output of the amplifier 111. However, due to, e.g., process variation, the resistor string 106 and the resistor string 110 are not matched (e.g., corresponding resistors may have slightly different resistance values), and/or the transistors M1, M2, and M3 are not matched. As a result, there is a small voltage difference between the voltage at the node 115 and the voltage at the node 107. When the small voltage difference is larger than certain threshold (e.g., larger than about 100 mV or about 200 mV), after the small voltage difference is amplified by the amplifier in, the output signal $V_{amp\_out}$ of the amplifier 111 may become saturated at the voltage level of the supply voltage $V_{DD}$ (e.g., 3 V), which corresponds to a logic high value. Therefore, an error occurs in the output (which is the demodulated PWM signal) of the comparator 121.

As discussed above, mismatch between the resistor strings 106 and 108, and/or mismatch among the transistors M1, M2, and M3, will generate an offset (e.g., offset from a zero voltage) in the output signal $V_{amp\_out}$ of the amplifier in, when there is no RF input signal or when the RF input signal is zero. Such an offset is also referred to as an offset in the DC operating point of the amplifier 111, or an offset in the DC operating point of the receiver circuit 100. The present disclosure discloses embodiment calibration circuits that can automatically adjust the DC operating point of the receiver circuit to a small, near-zero (e.g., less than 20 mV) value, such that the input signal of the comparator 121 is at the correct voltage level, and that the PWM signal can be demodulated correctly.

As illustrated in FIG. 3, the calibration circuit includes a plurality of switches, such as switches $S_{An}$, switches $S_{Bn}$, and a switch S*, where n=1, 2, ..., N. The calibration circuit also includes a calibration control circuit (see, e.g., 400A in FIG. 6, or 400B in FIG. 7) for controlling the switching (e.g., opening or closing) of the switches. The plurality of switches are coupled in parallel in FIG. 3. Each switch has a first terminal (e.g., the left terminal in FIG. 3) and a second terminal (e.g., the right terminal in FIG. 3). The first terminal of each switch is coupled to a node 113, which is coupled to a first input terminal (e.g., the positive input terminal) of the amplifier 111. The second terminal of each switch is coupled to a terminal of a respective resistor in the resistor string no. In particular, the second terminal (e.g., the right terminal in FIG. 3) of the switch $S_{An}$ (n=1, 2, ..., or N) is coupled to a terminal (e.g., the lower terminal in FIG. 3) of the resistor $R_{An}$ (n=1, 2, ..., or N) distal from the node 115, and the second terminal (e.g., the right terminal in FIG. 3) of the switch $S_{Bn}$ (n=1, 2, ..., or N) is coupled to a terminal (e.g., the upper terminal in FIG. 3) of the resistor $R_{Bn}$ (n=1, 2, ..., or N) distal from the node 115. The switch S* is coupled between the node 113 and the node 115. The plurality of switches are controlled by a respective control bit. For example, the switch $S_{An}$ (or $S_{Bn}$) is closed if a respective control bit $A_n$ (or $B_n$) is "1", and is open if the respective control bit is "0."

A calibration process to adjust the DC operating point of the receiver circuit 100 using the calibration circuit is now described. The calibration process may be performed during the startup of the receiver circuit 100 when PWM communication has not started. The calibration process may also be performed on-demand during operation of the receiver circuit 100 when, e.g., a large temperature change causes further offset in the DC operating point. For example, when a large temperature change is detected, an interrupt signal is sent to the receiver circuit 100, which interrupt signal sets the receiver circuit 100 in an interrupt mode. During the interrupt mode, demodulation of PWM signal is stopped, and the receiver circuit 100 performs the calibration process to compensate for the offset in the DC operating point. The interrupt mode may last, e.g., a few microseconds. Compared with a one-time calibration or trimming process performed at an initial programming phase or right after chip packaging, the presently disclosed calibration circuits and methods allow for on-demand, real-time calibration to compensate for DC operating point offset due to, e.g., temperature variations or component aging.

In some embodiments, to perform the calibration process, all of the switches $S_{An}$, $S_{Bn}$, and S* are open at the beginning of the calibration process. Then the switch S* is closed, and the sign of the output signal $V_{amp\_out}$ of the amplifier 111 is determined. For example, if the voltage at the node 113 (which is connected to the node 115 by the switch S* at this time) is higher than the voltage at the node 107, the sign of the output signal $V_{amp\_out}$ is positive, and if the voltage at the node 113 is lower than the voltage at the node 107, the sign of the output signal $V_{amp\_out}$ is negative. In ideal case (e.g., all corresponding components matched), the output signal $V_{amp\_out}$ is zero when S* is closed, in which case the calibration process is not needed and can stop at this stage.

The sign of the output signal $V_{amp\_out}$ is used to select a set of switches to adjust during the calibration process. In particular, if the output signal $V_{amp\_out}$ has a positive sign, then the switches $S_{An}$ (n=1, 2, ..., and N) are selected. On the other hand, if the output signal $V_{amp\_out}$ has a negative sign, then the switches $S_{Bn}$ (n=1, 2, ..., and N) are selected.

The calibration process proceeds by opening the switch S*. Next, the selected set of switches are closed one at a time along a direction from the switch S* toward a last switch in the selected set of switches distal from the switch S* (e.g., along a direction from $S_{A1}$ to $S_{AN}$, or along a direction from $S_{B1}$ to $S_{BN}$), until the sign of the output signal $V_{amp\_out}$ changes (e.g., changes from negative to positive, or from positive to negative), or until the last switch (e.g., $S_{AN}$ or $S_{BN}$) has been closed.

For example, if the switches $S_{An}$ are selected, then the switch $S_{A1}$ is first closed, and the sign of the output signal $V_{amp\_out}$ is checked after the switch $S_{A1}$ is first closed. If the sign changes, then the calibration process ends. If the sign does not change, the calibration process continues by opening the switch $S_{A1}$, and next, closing the switch $S_{A2}$ and checking the sign of the output signal $V_{amp\_out}$ after the switch $S_{A2}$ is closed. This process repeats, until the sign of the output signal $V_{amp\_out}$ changes, or until the last switch (e.g., $S_{AN}$) in the selected set of switches has been closed, at which point the calibration process ends. Note that during the calibration process, only one switch is closed at a time, and at most one switch is closed at any time.

Skilled artisans will readily appreciate that after the calibration process ends successfully (e.g., when the sign of the output signal $V_{amp\_out}$ changes), the voltage difference ε between the voltage at the node 113 and the voltage at the node 107 is at most ε=$RI_{bias}$, where R is resistance of each of the resistors $R_{An}$ and $R_{Bn}$, and $I_{bias}$ is the value of the current flowing through the resistor string no. Denote the gain of the amplifier 111 as G, then the maximum offset in the DC operating point is εG. By properly choosing the resistance R, the maximum offset in the DC operating point can be controlled below a target level, such as less than 50 mV, or less than 20 mV. As an example, the resistance R may be chosen to be less than 750Ω.

As another example, if the switches $S_{Bn}$ are selected, then the switches $S_{B1}$, $S_{B2}$, . . . , $S_{BN}$ are closed sequentially, one at a time, until the sign of the output signal $V_{amp\_out}$ changes, or until the last switch (e.g., $S_{BN}$) in the selected set of switches has been closed, at which point the calibration process ends. Details are similar to those discussed above for the example where the switches $S_{An}$ are selected, thus not repeated.

After the calibration process ends, the switch that is closed right before the calibration process ends stays closed after the calibration process. The positions of the switches after the calibration process ends represent the best configuration of the switches for minimizing the DC operating point, and this configuration is used in normal operation mode, where an RF signal (e.g., an OOK modulated PWM signal) is applied to the input terminals 102A and 102B and demodulated by the receiver circuit 100.

Figure 6:
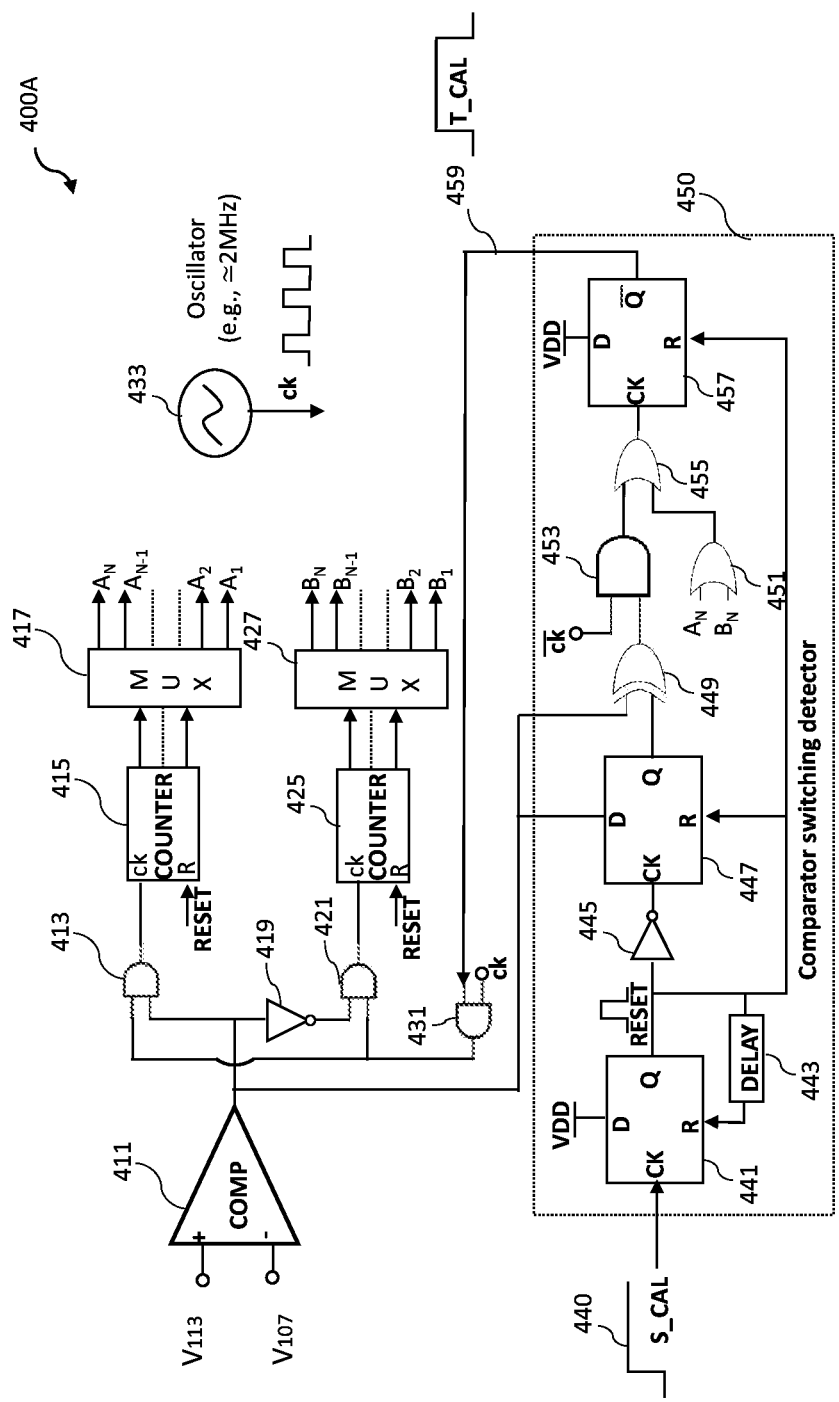
FIG. 6 illustrates a schematic diagram of a calibration control circuit, in an embodiment.

FIG. 6 illustrates a schematic diagram of a calibration control circuit 400A, in an embodiment. The calibration control circuit 400A may be used to control the switching (e.g., opening and closing) of the plurality of switches in FIG. 3 during the calibration process.

The calibration control circuit 400A includes a comparator switching detector circuit 450. The comparator switching detector circuit 450 is configured to generate a calibration enable signal 459 (e.g., a high-effective enable signal) for the calibration process. In the example of FIG. 6, the calibration enable signal 459 (also referred to as a T_CAL signal) rises from low to high at the beginning of the calibration process, stays high during the calibration process, and drops from high to low at the end of the calibration process. In the illustrated embodiment, during the calibration process, the comparator switching detector circuit 450 monitors the sign of the voltage difference between a voltage $V_{113}$ at the node 113 (see FIG. 3) and a voltage $V_{107}$ at the node 107 (see FIG. 3). As soon as the sign of the voltage difference changes, the comparator switching detector circuit 450 drops the calibration enable signal 459 from high to low, thereby disabling (e.g., ending) the calibration process. As illustrated in FIG. 6, the calibration enable signal 459 allows or disallows (e.g., disables) the calibration process by gating a clock signal CK using an AND gate 431. The clock signal CK is generated by an oscillator 433 and is used to drive counters 415 or 425 of the calibration control circuit 400A.

As illustrated in FIG. 6, the calibration control circuit 400A further includes a comparator 411 for comparing the voltage $V_{113}$ and the voltage $V_{107}$, and the output of the comparator 411 is the sign of the difference between the voltage $V_{113}$ and the voltage $V_{107}$. The comparator 411 may be the amplifier 111 in FIG. 3, in some embodiments. The output of the comparator 411 is used to select the set of switches (e.g., $S_{An}$ or $S_{Bn}$) to operate (e.g., to switch) in the calibration mode.

For example, during the calibration process, when the output of the comparator 411 is logic high, the AND gate 413 allows the clock signal CK to pass through to drive the counter 415. The output of the counter 415 is sent to a multiplexer circuit (MUX) 417, which is configured to generate control bits $A_n$, n=1, 2, . . . , N, where each of the control bits $A_n$ is used to control the switching of a respective switch $S_{An}$ in FIG. 3. With each clock cycle coming in, the output of the counter 415 increases by one to generate an output sequence of 1, 2, 3, . . . , and so on. The MUX 417 functions as a decoder circuit, which sets the control bit $A_n$ to one when the output of the counter 415 is n, and sets all other control bits $A_m$ to zero (m*n). Therefore, with each clock cycle coming into the counter 415, the switches $S_{A1}$, $S_{A2}$, . . . , $S_{AN}$ are closed sequentially, one at a time. Due to the inverter 419 inverting the logic high signal at the output of the comparator 411, the AND gate 421 is closed (e.g., forced to logic zero), and the clock signal CK could not pass through the AND gate 421 to drive the counter 425. In other words, the counter 425 is frozen and its output stays at zero.

As another example, when the output of the comparator 411 is logic low, the AND gate 413 is closed, thereby freezing the counter 415. The AND gate 421 is now open to allow the clock signal CK to drive the counter 425, which is coupled to a MUX 427. The MUX 427 functions in a similar way as the MUX 417 to generate the control bits $B_n$ for the switches $S_{Bn}$. Details are not repeated here.

Further details of the comparator switching detector circuit 450 are discussed hereinafter to gain insight into its operation. As illustrated in FIG. 6, the comparator switching detector circuit 450 includes D flip-flops 441, 447, and 457. The data input terminals D of the D flip-flops 441 and 457 are connected to a logic high signal (e.g., $V_{DD}$), while the data input terminal D of the D flip-flop 447 is connected to the output of the comparator 411. The calibration enable signal 459 is generated at the inverted output terminal $\overline{Q}$ of the D flip-flop 457.

To start the calibration process, a signal 440 (also referred to as the S_CAL signal) with a step function shape is applied to the clock terminal CK of the D flip-flop 441, which latches the logic high value (e.g. $V_{DD}$) to its output terminal Q. The output of the D flip-flop 441 is delayed by a delay element 443 and applied to its reset terminal R, which forces the output at its output terminal Q back to logic low, thereby generating a reset pulse RESET. The reset pulse RESET is used to reset other components (e.g., 447, 457, 415, 425) in the calibration control circuit 400A. The reset pulse RESET may also be used as the control bit for the switch S* in FIG. 3, which closes the switch S* for a short period then opens it. Another option for generating the control bit for the switch S* is to connect the $A_1$ and $B_1$ control bits to the input terminals of an OR gate, and use the output of the OR gate as the control bit for the switch S*.

As illustrated in FIG. 6, the reset pulse RESET is inverted by the inverter 445 and used as the clock signal CK for the D flip-flop 447, which latches the output value of the comparator 411 at the beginning of the calibration process at its output terminal Q. Before the calibration process ends, the output of the comparator 411 remains unchanged. As a result, the XOR gate 449 receives two identical input signals and generates a logic low output, which forces the output of the AND gate 453 to logic low. Note that before the last switch (e.g., $S_{AN}$ or $S_{BN}$) of the selected set of switches is closed, the control bit AN and BN are zero, which results in a zero (e.g., logic low) output at the OR gate 451. Therefore, the output of the OR gate 455 is also zero before the calibration process ends, forcing the clock terminal CK of the D flip-flop 457 to be zero. As a result, the inverter output terminal $\overline{Q}$ of the D flip-flop 457 maintains a logic high value after the reset throughout the calibration process.

When the output of the comparator 411 changes sign, the output at the Q terminal of the D flip-flop 447 does not change because there is no clock signal to latch the new value. As a result, the two input signals to the XOR gate 449 are different, and the output of the XOR gate 449 is one (e.g., logic high), which opens the AND gate 453 to allow an inverted clock signal $\overline{CK}$ to pass through and drive the D flip-flop 457. At the next clock cycle of the inverted clock signal $\overline{CK}$, the logic high value (e.g., $V_{DD}$) is latched into the D flip-flop 457, and the inverted output terminal $\overline{Q}$ of the D flip-flop 457 turns low, which signals the end of the calibration process. Note that another trigger event for ending the calibration process is when $A_N$ or $B_N$ changes to one (e.g., when the last switch in the selected set of switches is closed), in which case the OR gate 451 outputs a logic high signal, which in turn causes the output of the OR gate 455 to become logic high, thereby creating a rising edge at the clock terminal CK of the D flip-flop 457 to latch the logic high value (e.g., $V_{DD}$) in the D flip-flop 457. The output at the inverted output terminal $\overline{Q}$ of the D flip-flop 457 turns to a logic low value to end the calibration process.

Figure 7:
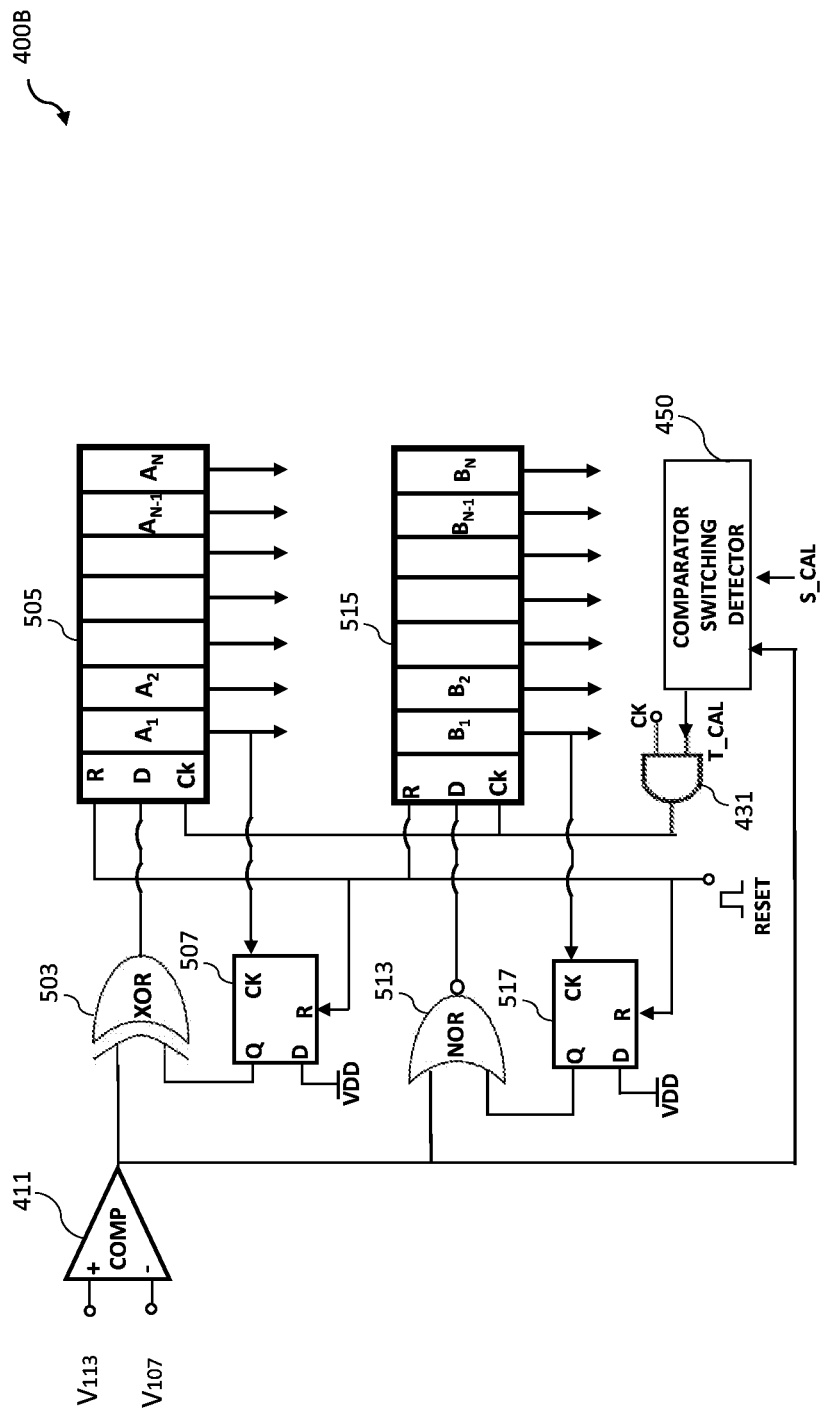
FIG. 7 illustrates a schematic diagram of a calibration control circuit, in another embodiment.

FIG. 7 illustrates a schematic diagram of a calibration control circuit 400B, in another embodiment. The calibration control circuit 400B may be used to control the calibration process, similar as the calibration control circuit 400A. The calibration control circuit 400B is similar to the calibration control circuit 400A (e.g., having the same comparator switching detector circuit 450), but instead of using the counters 415/425 and the MUX 417/427 in FIG. 6, shift registers 505 and 515 are used in FIG. 7 to simplify the design.

Referring to FIG. 7, the comparator switching detector circuit 450 generates the reset signal RESET and the calibration enable signal T_CAL, as discussed above with reference to FIG. 6. The reset signal RESET resets the D flip-flops 507 and 517, and the shift registers 505 and 515. The clock signal CK is sent to drive both shift registers 505 and 515. Depending on the output of the comparator 411, the input signal applied to the input terminal D of the shift register 505 (or 515) is one or zero, as described below.

For example, after the calibration process starts, the outputs of the D flip-flops 507 and 517 are reset to zero. When the output of the comparator 411 is one, the output of the XOR gate 503 is one, which is sent to the input terminal D of the shift registers 505. At the first input clock cycle, the value of "1" is shifted into the first register $A_1$ (e.g., the leftmost register) of the shift register 505. The output of the first register $A_1$ is connected to the clock terminal CK of the D flip-flop 507. When the value "1" is shifted into the first register $A_1$, a rising edge is generated at the clock terminal CK of the D flip-flop 507, which latches the logic high signal (e.g., $V_{DD}$) at its input data terminal D, and the output terminal Q of the D flip-flop 507 rises to high (e.g., a "1" value), thereby generating a zero output at the XOR gate 503. This ensures that subsequent input data to the shift register 505 are zeros, and the value "1" in the first register $A_1$ is shifted to the right with subsequent clock cycles. The values of the registers $A_1, A_2, \ldots, A_N$ in the shift register 505 are used as the control bits $A_n$ (n=1, 2, ..., N) in FIG. 3. Note that when the output of the comparator 411 is one, the output of the NOR gate 513 is zero, which is sent to the input terminal D of the shift register 515. The values of the registers $B_n$ (n=1, 2, ..., N) of the shift register 515 stay at the value zero, and are used as the control bits $B_n$ (n=1, 2, ..., N) in FIG. 3.

As another example, when the output of the comparator 411 is zero, a value of "1" is shifted down the shift register 515 to control the switching of the switches $S_{Bn}$, and a value of "0" is shifted down the shifter register 505 such that the switches $S_{An}$ remain open during the calibration process. Skilled artisans, upon reading the discussion for the previous example, should be able to readily analyze the operation of the calibration control circuit 400B for the current example. Details are not discussed here.

Figure 8:
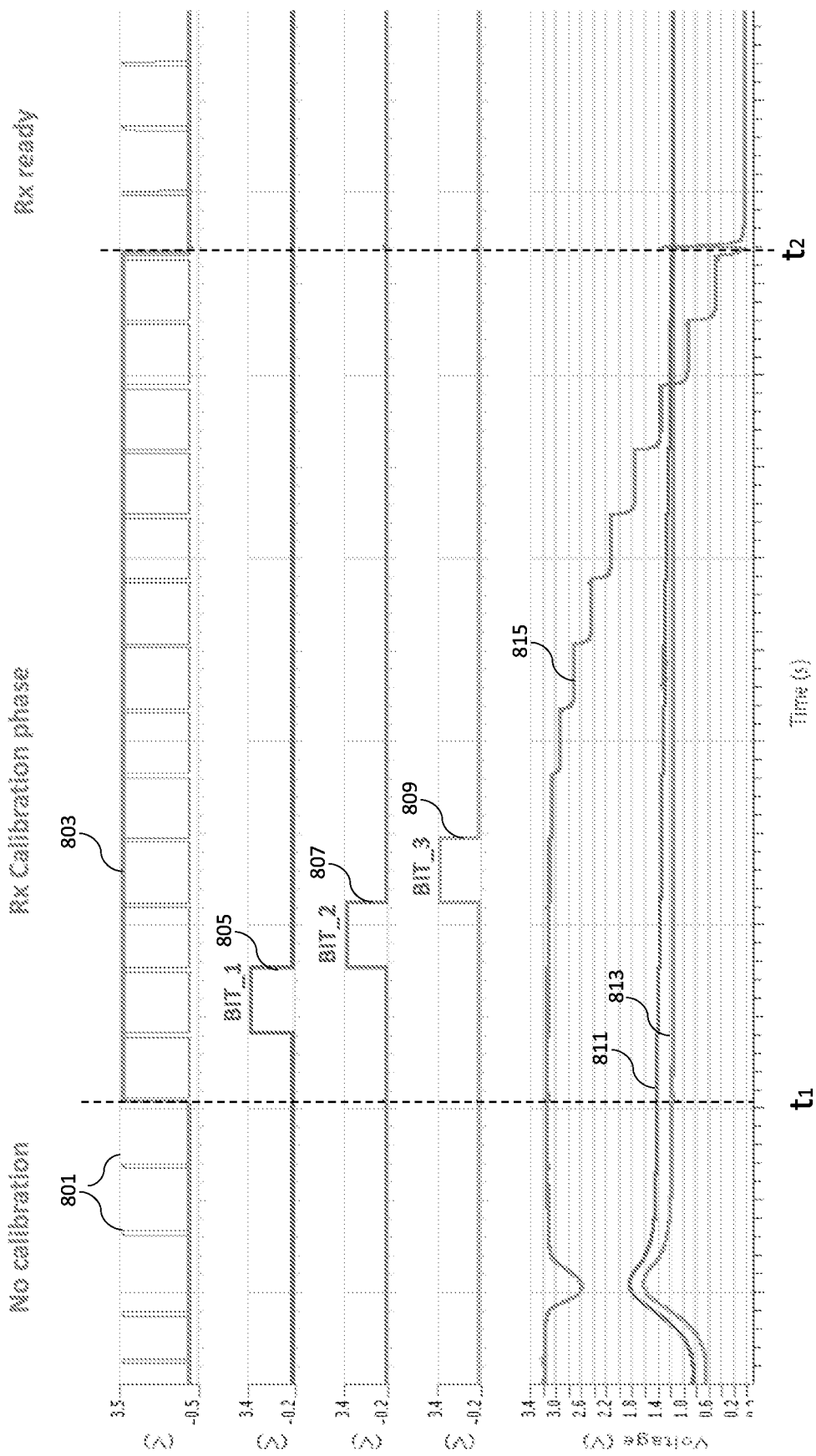
FIG. 8 illustrates a timing diagram of the receiver circuit of FIG. 3, in an embodiment.

FIG. 8 illustrates a timing diagram of the receiver circuit 100 of FIG. 3 during a calibration process, in an embodiment. In FIG. 8, the signal 801 illustrates the clock signal CK in FIG. 6 or FIG. 7, and the signal 803 illustrates the calibration enable signal T_CAL. The signals 805, 807, and 809 illustrate the first three of the bit control signals, such as $A_1, A_2,$ and $A_3$ (or $B_1, B_2,$ and $B_3$) respectively. The signal 811 illustrates the reference voltage at the node 113 (see FIG. 3) provided by the bias circuit 108, the signal 813 illustrates the voltage at the node 107 provided by the envelope detector 104, and the signal 815 illustrates the output signal $V_{amp\_out}$ of the amplifier 111 of FIG. 3.

As illustrated in FIG. 8, before the calibration process starts, due to component mismatch, there is a relatively large (e.g., larger than 200 mV, such as 250 mV) voltage difference between the signal 811 and 813, which results in the output signal $V_{amp\_out}$ of the amplifier 111 to be saturated at the $V_{DD}$ level (e.g., 3 V). As the calibration processes starts at time t1, the control bits sequentially close the switches in the selected set of switches one at a time. The difference between the signal 811 and 813 decreases with each clock cycle. At time t2, the calibration process ends, as indicated by the falling edge of the T_CAL signal 803. The output signal $V_{amp\_out}$ of the amplifier 111 is reduced to a small level of, e.g., less than 100 mv, or less than 20 mV. In other words, the DC operating point of the receiver circuit 100 has been adjusted to a small enough level to avoid or reduce demodulation error.

Figure 9:
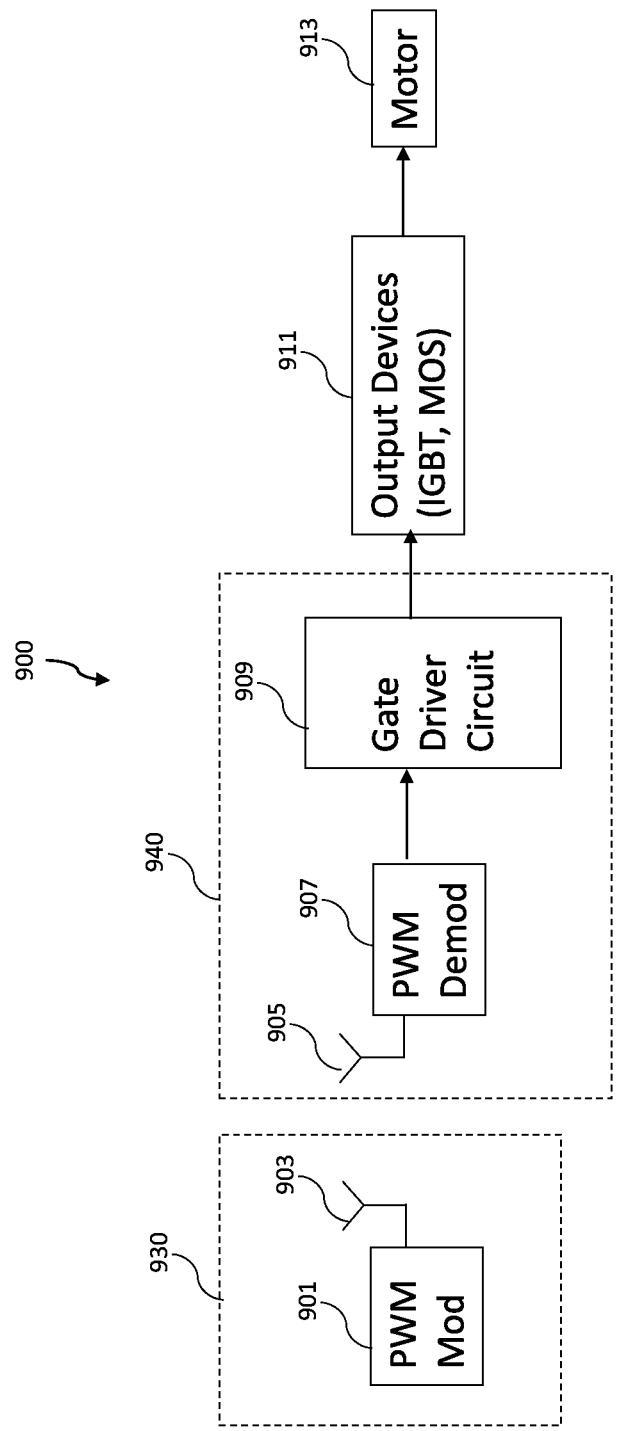
FIG. 9 illustrates a block diagram of a motor control system, in an embodiment.

FIG. 9 illustrates a block diagram of a motor control system 900, in an embodiment. The motor control system 900 includes a transmitter 930 that includes a PWM modulator 901 and a micro-antenna 903. The motor control system 900 also includes a receiver circuit 940 that includes a micro-antenna 905, a PWM demodulator 907, and a gate driver circuit 909. The receiver circuit 940 may correspond to the receiver circuit 100 of FIG. 3. The motor control system 900 further includes an output device 911, such as power converters comprising power witches (e.g., IGBT power switches, or MOSFET power switches). The output of the output device 911 is used to drive a motor 913. In some embodiments, the transmitter 930 transmits an OOK modulated PWM signal. The receiver circuit 940 receives and demodulates the OOK modulated PWM signal. The output of the PWM demodulator 907, which is the demodulated PWM signal, is used to control the output device 911 (e.g., a power converter) to provide a driving voltage/current to the motor 913.

Figure 10B:
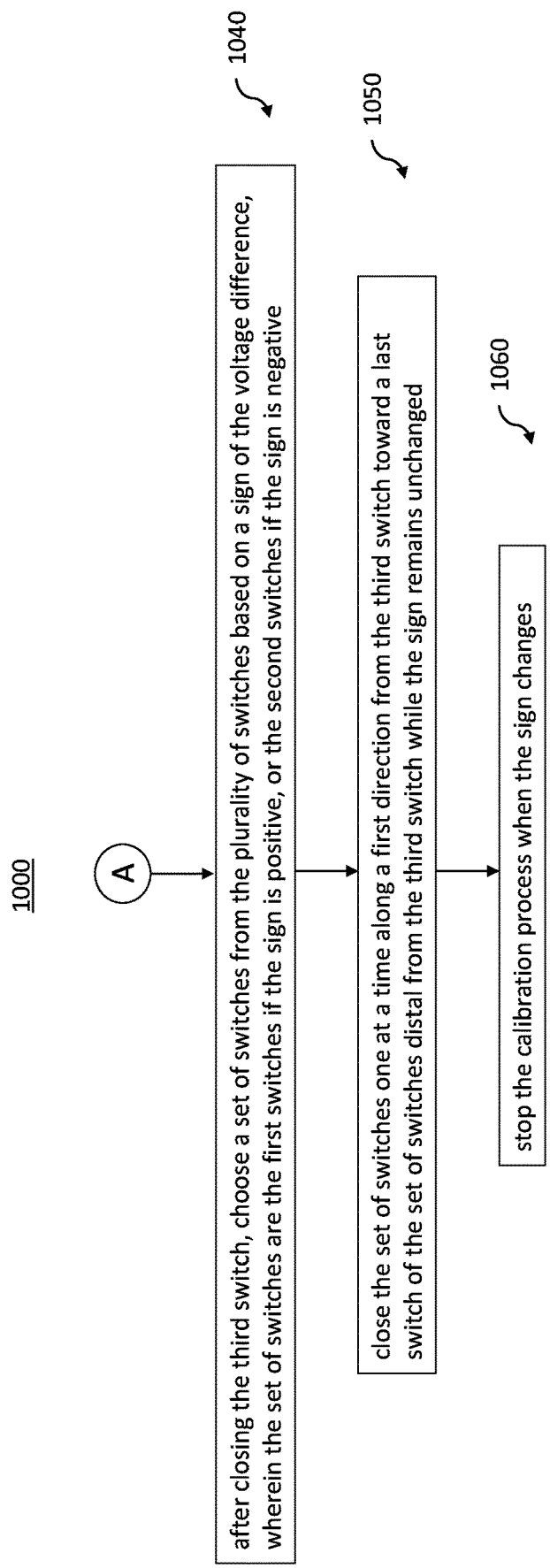

FIGS. 10A and 10B together illustrate a flow chart of a method of calibrating a receiver circuit, in accordance with some embodiments. It should be understood that the embodiment method shown in FIGS. 10A and 10B is merely an example of many possible embodiment methods. One of ordinary skill in the art would recognize many variations, alternatives, and modifications. For example, various steps as illustrated in FIGS. 10A and 10B may be added, removed, replaced, rearranged, or repeated.

Referring to FIGS. 10A and 10B, at block 1010, a voltage difference between a first node of the receiver circuit and a second node of the receiver circuit is measured, wherein the receiver circuit comprises: an envelope detector configured to detect an envelope of an input signal of the receive circuit, wherein the envelope detector comprises a first resistor string coupled to a first transistor and a second transistor that are coupled in parallel, wherein the first resistor string comprises first resistors coupled in series and second resistors coupled in series, with the first resistors and the second resistors connected at the second node; a bias circuit configured to provide a reference voltage, wherein the bias circuit comprises a second resistor string coupled to a third transistor, wherein the second resistor string comprises third resistors coupled in series and fourth resistors coupled in series, with the third resistors and the fourth resistors connected at a third node; a plurality of switches coupled in parallel, wherein the plurality of switches comprise first switches, second switches, and a third switch, wherein each of the first switches is coupled between the first node and a first terminal of a respective one of the third resistors distal from the third node, wherein each of the second switches is coupled between the first node and a second terminal of a respective one of the fourth resistors distal from the third node, and wherein the third switch is coupled between the first node and the third node; and an amplifier, wherein a first input terminal of the amplifier is coupled to the first node, and a second input terminal of the amplifier is coupled to the second node, wherein the voltage difference is generated at an output terminal of the amplifier. At block 1020, the plurality of switches are opened. At block 1030, after opening the plurality of switches, the third switch is closed. At block 1040, after closing the third switch, a set of switches is chosen from the plurality of switches based on a sign of the voltage difference, wherein the set of switches are the first switches if the sign is positive, or the second switches if the sign is negative. At block 1050, the set of switches are closed one at a time along a first direction from the third switch toward a last switch of the set of switches distal from the third switch while the sign remains unchanged. At block 1060, the calibration process is stopped when the sign changes.

Disclosed embodiments may achieve advantages. The disclosed embodiment receiver circuit has a calibration circuit which allows for automatic adjustment of the DC operating point of the receiver circuit. The calibration process can be performed during a calibration mode to reduce the offset in the DC operating point to a target level, such that the received RF signal can be demodulated properly. The calibration process can be performed on-demand, e.g., in the field for deployed devices to compensate for factors such as temperature drifting and component aging. As a result, the receiver achieves improved performance and provides robustness against adverse effects such as temperature variation and component aging.

Example embodiments of the present invention are summarized here. Other embodiments can also be understood from the entirety of the specification and the claims filed herein.

Example 1. In an embodiment, a receiver circuit includes: a first resistor string comprising a plurality of resistors coupled in series; a second resistor string comprising a plurality of resistors coupled in series; a first transistor and a second transistor coupled in parallel, wherein a first load path terminal of the first transistor and a first load path terminal of the second transistor are coupled to a reference voltage node, wherein a second load path terminal of the first transistor and a second load path terminal of the second transistor are coupled to a first end of the first resistor string, with a second end of the first resistor string being coupled to a supply voltage node, wherein a first control terminal of the first transistor and a second control terminal of the second transistor are coupled to a first input terminal of the receiver circuit and a second input terminal of the receiver circuit, respectively; a third transistor, wherein a first load path terminal of the third transistor is coupled to the reference voltage node, and a second load path terminal of the third transistor is coupled to a first end of the second resistor string, with a second end of the second resistor string being coupled to the supply voltage node, wherein a control terminal of the third transistor is coupled to a bias voltage node; a plurality of switches coupled in parallel, wherein each switch of the plurality of switches has a first terminal and a second terminal, wherein the first terminals of the plurality of switches are coupled to a first node, wherein the second terminal of each switch is coupled to a terminal of a respective resistor in the second resistor string; and an amplifier, wherein a first input terminal of the amplifier is coupled to the first node, and a second input terminal of the amplifier is coupled to a second node in the first resistor string.

Example 2. The receiver circuit of Example 1, wherein the amplifier is configured to amplify a voltage difference between the first node and the second node, wherein the receiver circuit further comprises a hysteresis comparator coupled to an output terminal of the amplifier.

Example 3. The receiver circuit of Example 1, wherein the first transistor, the second transistor, and the third transistor are substantially the same, wherein the first resistor string and the second resistor string are substantially the same.

Example 4. The receiver circuit of Example 3, wherein the bias voltage node is coupled to the first control terminal of the first transistor and the second control terminal of the second transistor through a first coupling resistor and a second coupling resistor, respectively, wherein the first coupling resistor and the second coupling resistor have a same nominal resistance value.

Example 5. The receiver circuit of Example 3, wherein the plurality of resistors in the second resistor string comprise: first resistors coupled in series between the first end of the second resistor string and a third node; second resistors coupled in series between the third node and a fourth node; and a third resistor coupled between the fourth node and the second end of the second resistor string, and wherein the plurality of switches comprise: first switches, wherein each of the first switches is coupled between the first node and a first terminal of a respective one of the first resistors, the first terminal being distal from the third node; second switches, wherein each of the second switches is coupled between the first node and a second terminal of a respective one of the second resistors, the second terminal being distal from the third node; and a third switch coupled between the first node and the third node.

Example 6. The receiver circuit of Example 5, wherein the receiver circuit is configured to perform a calibration process by: opening the plurality of switches; after opening the plurality of switches, closing the third switch; after closing the third switch, determining a sign of a voltage difference between the first node and the second node; and in response to determining that the sign is positive: opening the third switch; after opening the third switch, closing the first switches one at a time along a first direction from the third node toward the first end of the second resistor string while the sign is positive; and stopping the calibration process when the sign turns negative.

Example 7. The receiver circuit of Example 6, wherein closing the first switches one at a time comprises: closing a first one of the first switches that is immediately adjacent to the third switch; determining whether the sign is changed after closing the first one of the first switches; and continuing the calibration process if the sign is not changed.

Example 8. The receiver circuit of Example 7, wherein continuing the calibration process comprises: opening the first one of the first switches; after opening the first one of the first switches, closing a second one of the first switches that is immediately adjacent to the first one of the first switches; determining whether the sign is changed after closing the second one of the first switches; and continuing the calibration process if the sign is not changed.

Example 9. The receiver circuit of Example 6, wherein the receiver circuit is further configured to perform the calibration process by: in response to determining that the sign is negative: opening the third switch; and after opening the third switch, closing the second switches one at a time along a second direction from the third node toward the second end of the second resistor string while the sign is negative; and stopping the calibration process when the sign turns positive.

Example 10. The receiver circuit of Example 6, wherein the after stopping the calibration process, a single switch of the plurality of switches is closed, wherein the receiver circuit is further configured to, after stopping the calibration process: keeping the single switch of the plurality of switches closed; and demodulating a received signal coupled to the first and second input terminals of the receiver circuit.

Example 11. In an embodiment, a circuit for demodulating an on-off keying (OOK) modulated pulse-width modulation (PWM) signal includes: an envelope detector configured to detect an envelope of the OOK modulated PWM signal, comprising: a first resistor string comprising resistors coupled in series; and a first transistor and a second transistor coupled in parallel between a first end of the first resistor string and a reference voltage node, wherein a second end of the first resistor string is coupled to a supply voltage node; a bias circuit configured to provide a reference voltage, comprising: a second resistor string comprising resistors coupled in series; and a third transistor coupled between a first end of the second resistor string and the reference voltage node, wherein a second end of the second resistor string is coupled to the supply voltage node; a plurality of switches coupled in parallel, wherein each switch of the plurality of switches has a first terminal and a second terminal, wherein the first terminal of each switch is coupled to a first node, and the second terminal of each switch is coupled to a terminal of a respective resistor in the second resistor string; an amplifier, wherein a first input terminal of the amplifier is coupled to the first node, and a second input terminal of the amplifier is coupled to a second node in the first resistor string; and a comparator coupled to an output terminal of the amplifier.

Example 12. The circuit of Example 11, wherein the first resistor string and the second resistor string have a same number of resistors, wherein each resistor in the first resistor string has a corresponding resistor in the second resistor string, wherein each resistor in the first resistor string and the corresponding resistor in the second resistor string have a same nominal resistance value.

Example 13. The circuit of Example 12, wherein the second resistor string comprises: first resistors coupled in series between the first end of the second resistor string and a third node; second resistors coupled in series between the third node and a fourth node; and a third resistor coupled between the fourth node and the supply voltage node, and wherein the plurality of switches comprise: first switches, wherein each of the first switches is coupled between the first node and a first terminal of a respective one of the first resistors distal from the third node; second switches, wherein each of the second switches is coupled between the first node and a second terminal of a respective one of the second resistors distal from the third node; and a third switch coupled between the first node and the third node.

Example 14. The circuit of Example 13, wherein the circuit is configured to perform a calibration process by: opening the plurality of switches; after opening the plurality of switches, closing the third switch; after closing the third switch, determining a sign of a voltage difference between the first node and the second node; choosing a set of switches based on the sign of the voltage difference, wherein the set of switches are the first switches if the sign is positive, or the second switches if the sign is negative; closing the set of switches one at a time along a first direction from the third switch toward a last switch of the set of switches distal from the third switch while the sign remains unchanged; and stopping the calibration process when the sign changes.

Example 15. The circuit of Example 14, wherein closing the set of switches one at a time comprises: closing a first one of the set of switches that is closest to the third switch; after closing the first one of the set of switches, opening the first one of the set of switches; and after opening the first one of the set of switches, closing a second one of the set of switches closest to the first one of the set of switches.

Example 16. The circuit of Example 13, wherein the first resistor string comprises: fourth resistors coupled in series between the first end of the first resistor string and the second node; fifth resistors coupled in series between the second node and a fifth node; and a sixth resistor coupled between the fifth node and the supply voltage node.

Example 17. In an embodiment, a method of calibrating a receiver circuit includes: measuring a voltage difference between a first node of the receiver circuit and a second node of the receiver circuit, wherein the receiver circuit comprises: an envelope detector configured to detect an envelope of an input signal of the receive circuit, wherein the envelope detector comprises a first resistor string coupled to a first transistor and a second transistor that are coupled in parallel, wherein the first resistor string comprises first resistors coupled in series and second resistors coupled in series, with the first resistors and the second resistors connected at the second node; a bias circuit configured to provide a reference voltage, wherein the bias circuit comprises a second resistor string coupled to a third transistor, wherein the second resistor string comprises third resistors coupled in series and fourth resistors coupled in series, with the third resistors and the fourth resistors connected at a third node; a plurality of switches coupled in parallel, wherein the plurality of switches comprise first switches, second switches, and a third switch, wherein each of the first switches is coupled between the first node and a first terminal of a respective one of the third resistors distal from the third node, wherein each of the second switches is coupled between the first node and a second terminal of a respective one of the fourth resistors distal from the third node, and wherein the third switch is coupled between the first node and the third node; and an amplifier, wherein a first input terminal of the amplifier is coupled to the first node, and a second input terminal of the amplifier is coupled to the second node, wherein the voltage difference is generated at an output terminal of the amplifier; opening the plurality of switches; after opening the plurality of switches, closing the third switch; after closing the third switch, choosing a set of switches from the plurality of switches based on a sign of the voltage difference, wherein the set of switches are the first switches if the sign is positive, or the second switches if the sign is negative; closing the set of switches one at a time along a first direction from the third switch toward a last switch of the set of switches distal from the third switch while the sign remains unchanged; and stopping calibrating the receiver circuit when the sign changes.

Example 18. The method of Example 17, wherein the first transistor and the second transistor are coupled between the first resistors and a reference voltage node, wherein the third transistor is coupled between the third resistors and the reference voltage node.

Example 19. The method of Example 18, wherein closing the set of switches one at a time comprises: closing a first one of the set of switches that is closest to the third switch; after closing the first one of the set of switches, opening the first one of the set of switches; and after opening the first one of the set of switches, closing a second one of the set of switches closest to the first one of the set of switches.

Example 20. The method of Example 19, wherein after stopping calibrating the receiver circuit, only one of the plurality of switches is closed.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A receiver circuit comprising:
   a first resistor string comprising a first plurality of resistors coupled in series, wherein the first plurality of resistors comprise first resistors and second resistors connected at a first node;
   a first transistor and a second transistor coupled in parallel between a first end of the first resistor string and a reference voltage node, wherein a second end of the first resistor string is coupled to a supply voltage node;
   a second resistor string comprising a second plurality of resistors coupled in series, wherein the second plurality of resistors comprise third resistors and fourth resistors connected at a second node;
   a third transistor coupled between a first end of the second resistor string and the reference voltage node, wherein a second end of the second resistor string is coupled to the supply voltage node;
   a plurality of switches coupled in parallel, wherein each switch of the plurality of switches is coupled between a third node and a respective node in the second resistor string; and
   an amplifier, wherein a first input terminal of the amplifier is coupled to the first node, and a second input terminal of the amplifier is coupled to the third node.

2. The receiver circuit of claim 1, further comprising:
   a hysteresis comparator coupled to an output terminal of the amplifier; and
   a driver circuit coupled to an output terminal of the hysteresis comparator.

3. The receiver circuit of claim 1, wherein a first control terminal of the first transistor and a second control terminal of the second transistor are coupled to a first input terminal of the receiver circuit and a second input terminal of the receiver circuit, respectively, and wherein a third control terminal of the third transistor is coupled to a bias voltage node.

4. The receiver circuit of claim 3, further comprising:
   a first coupling resistor coupled between the first control terminal of the first transistor and the bias voltage node; and
   a second coupling resistor coupled between the second control terminal of the second transistor and the bias voltage node.

5. The receiver circuit of claim 1, wherein the plurality of switches comprise:
   first switches, wherein each of the first switches is coupled between the third node and a first terminal of a respective one of the third resistors, the first terminal being distal from the second node;
   second switches, wherein each of the second switches is coupled between the third node and a second terminal of a respective one of the fourth resistors, the second terminal being distal from the second node; and
   a third switch coupled between the third node and the second node.

6. The receiver circuit of claim 5, wherein the third resistors are between the fourth resistors and the third transistor, wherein the receiver circuit further comprising a calibration control circuit configured to generate control signals for the plurality of switches during a calibration process.

7. The receiver circuit of claim 6, wherein the calibration control circuit is configured to perform the calibration process by:
   opening the plurality of switches;
   after opening the plurality of switches, closing the third switch;
   after closing the third switch, comparing a voltage at the first node and a voltage at the third node; and
   in response to determining that the voltage at the third node is higher than the voltage at the first node:
     opening the third switch;
     after opening the third switch, closing the first switches one at a time along a first direction from the second node toward the first end of the second resistor string while the voltage at the third node is higher than the voltage at the first node; and
     stopping the calibration process when the voltage at the third node is lower than or equal to the voltage at the first node.

8. The receiver circuit of claim 7, wherein closing the first switches one at a time comprises:
   closing a first one of the first switches that is immediately adjacent to the third switch;
   after closing the first one of the first switches, determining whether the voltage at the third node is higher than the voltage at the first node; and
   continuing the calibration process if the voltage at the third node is higher than the voltage at the first node.

9. The receiver circuit of claim 8, wherein continuing the calibration process comprises:
   opening the first one of the first switches;
   after opening the first one of the first switches, closing a second one of the first switches that is immediately adjacent to the first one of the first switches;

after closing the second one of the first switches, determining whether the voltage at the third node is higher than the voltage at the first node; and continuing the calibration process if the voltage at the third node is higher than the voltage at the first node.

10. The receiver circuit of claim 6, wherein the calibration control circuit comprises:
a first circuit configured to generate a calibration enable signal, wherein the first circuit comprises:
a first D flip-flop, wherein an input terminal of the first D flip-flop is configured to be coupled to a logic high signal, a clock terminal of the first D flip-flop is configured to be supplied with a step function signal at a beginning of the calibration process;
a delay element coupled between an output terminal of the first D flip-flop and a reset terminal of the first D flip-flop;
a second D flip-flop, wherein an input terminal of the second D flip-flop is coupled to an output terminal of the amplifier;
a first inverter coupled between the output terminal of the first D flip-flop and a clock terminal of the second D flip-flop;
a first XOR gate, wherein a first input terminal of the first XOR gate is coupled to an output terminal of the second D flip-flop, and a second input terminal of the first XOR gate is coupled to the output terminal of the amplifier;
a first AND gate, wherein a first input terminal of the first AND gate is coupled to an output terminal of the first XOR gate, and a second input terminal of the first AND gate is coupled to an inverted clock signal; and
a third D flip-flop, wherein a clock terminal of the third D flip-flop is coupled to an output terminal of the first AND gate, an input terminal of the third D flip-flop is configured to be coupled to the logic high signal, wherein the calibration enable signal is generated at an inverted output terminal of the third D flip-flop.

11. The receiver circuit of claim 10, wherein the calibration control circuit further comprises:
a second AND gate, wherein a first input terminal of the second AND gate is coupled to the calibration enable signal, and a second input terminal of the second AND gate is coupled to a clock signal;
a third AND gate and a fourth AND gate, wherein a first input terminal of the third AND gate and a first input terminal of the fourth AND gate are coupled to an output terminal of the third AND gate, wherein a second input terminal of the third AND gate is coupled to the output terminal of the amplifier;
a second inverter coupled between the output terminal of the amplifier and a second input terminal of the fourth AND gate;
a first counter and a second counter, wherein a first clock terminal of the first counter and a second clock terminal the second counter are coupled to an output terminal of the third AND gate and an output terminal of the fourth AND gate, respectively; and
a first multiplexer (MUX) coupled to the first counter and a second MUX coupled to the second counter, wherein the first MUX is configured to convert an output of the first counter into a first plurality of control bits for the first switches, wherein the second MUX is configured to convert an output of the second counter into a second plurality of control bits for the second switches.

12. The receiver circuit of claim 10, wherein the calibration control circuit further comprises:
a second AND gate, wherein a first input terminal of the second AND gate is coupled to the calibration enable signal, and a second input terminal of the second AND gate is coupled to the clock signal;
a second XOR gate, wherein a first input terminal of the second XOR gate coupled to the output terminal of the amplifier;
a fourth D flip-flop, wherein an input terminal of the fourth D flip-flop is configured to be coupled to the logic high signal, an output terminal of the fourth D flip-flop is coupled to a second input terminal of the second XOR gate;
a first shift register, wherein an input terminal of the first shift register is coupled to an output terminal of the second XOR gate, a clock terminal of the first shift register is coupled to an output terminal of the second AND gate, wherein an output of a first register in the first shift register is coupled to a clock terminal of the fourth D flip-flop;
an NOR gate, wherein a first input terminal of the NOR gate is coupled to the output terminal of the amplifier;
a fifth D flip-flop, wherein an input terminal of the fifth D flip-flop is configured to be coupled to the logic high signal, an output terminal of the fifth D flip-flop is coupled to a second input terminal of the NOR gate; and
a second shift register, wherein an input terminal of the second shift register is coupled to an output terminal of the NOR gate, a clock terminal of the second shift register is coupled to the output terminal of the second AND gate, wherein an output of a first register in the second shift register is coupled to a clock terminal of the fifth D flip-flop.

13. A circuit for demodulating an on-off keying (OOK) modulated pulse-width modulation (PWM) signal, the circuit comprising:
an envelope detector configured to detect an envelope of the OOK modulated PWM signal, comprising:
a first resistor string comprising resistors coupled in series; and
a first transistor and a second transistor coupled in parallel, wherein the first resistor string is coupled between a supply voltage node and the first and second transistors;
a bias circuit configured to provide a reference voltage, comprising:
a second resistor string comprising resistors coupled in series; and
a third transistor, wherein the second resistor string is coupled between the supply voltage node and the third transistor;
a plurality of switches coupled in parallel, wherein each switch of the plurality of switches has a first terminal and a second terminal, wherein the first terminal of each switch is coupled to a first node, and the second terminal of each switch is coupled to a terminal of a respective resistor in the second resistor string;
an amplifier, wherein a first input terminal of the amplifier is coupled to the first node, and a second input terminal of the amplifier is coupled to a second node in the first resistor string; and
a comparator coupled to an output terminal of the amplifier.

14. The circuit of claim 13, further comprising a calibration control circuit configured to generate control signals for the plurality of switches during a calibration process.

15. The circuit of claim 14, wherein the second resistor string comprises:
   first resistors coupled in series between the third transistor and a third node in the second resistor string; and
   second resistors coupled in series between the third node and the supply voltage node, and
   wherein the plurality of switches comprise:
      first switches, wherein each of the first switches is coupled between the first node and a first terminal of a respective one of the first resistors distal from the third node;
      second switches, wherein each of the second switches is coupled between the first node and a second terminal of a respective one of the second resistors distal from the third node; and
      a third switch coupled between the first node and the third node.

16. The circuit of claim 15, wherein the calibration control circuit is configured to perform the calibration process by:
   opening the plurality of switches;
   after opening the plurality of switches, closing the third switch;
   after closing the third switch, determining a sign of a voltage difference between the first node and the second node;
   choosing a set of switches based on the sign of the voltage difference, wherein the set of switches are the first switches if the sign is positive, or the second switches if the sign is negative;
   closing the set of switches one at a time along a first direction from the third switch toward a last switch of the set of switches distal from the third switch while the sign remains unchanged; and
   stopping the calibration process when the sign changes.

17. A method of calibrating a receiver circuit, the method comprising:
   measuring a voltage difference between a first node of the receiver circuit and a second node of the receiver circuit, wherein the receiver circuit comprises:
      an envelope detector configured to detect an envelope of an input signal of the receive circuit, wherein the envelope detector comprises a first resistor string, wherein the first resistor string comprises first resistors coupled in series and second resistors coupled in series, with the first resistors and the second resistors connected at the second node;
      a bias circuit configured to provide a reference voltage, wherein the bias circuit comprises a second resistor string, wherein the second resistor string comprises third resistors coupled in series and fourth resistors coupled in series, with the third resistors and the fourth resistors connected at a third node;
      a plurality of switches, wherein the plurality of switches comprise first switches, second switches, and a third switch, wherein each of the first switches is coupled between the first node and a first terminal of a respective one of the third resistors distal from the third node, wherein each of the second switches is coupled between the first node and a second terminal of a respective one of the fourth resistors distal from the third node, and wherein the third switch is coupled between the first node and the third node; and
      an amplifier, wherein a first input terminal of the amplifier is coupled to the first node, and a second input terminal of the amplifier is coupled to the second node, wherein the voltage difference is generated at an output terminal of the amplifier;
   opening the plurality of switches;
   after opening the plurality of switches, closing the third switch;
   after closing the third switch, choosing a set of switches from the plurality of switches based on a sign of the voltage difference;
   closing the set of switches one at a time along a first direction from the third switch toward a last switch of the set of switches distal from the third switch while the sign remains unchanged; and
   stopping calibrating the receiver circuit when the sign changes.

18. The method of claim 17, wherein the envelope detector further comprises a first transistor and a second transistor coupled in parallel between the first resistor string and a reference voltage node, wherein the bias circuit comprises a third transistor coupled between the second resistor string and the reference voltage node, wherein the third resistors are between the third transistor and the fourth resistors.

19. The method of claim 18, wherein the voltage difference is a difference between a voltage at the first node and a voltage at the second node, wherein the first switches are selected as the set of switches if the sign of the voltage difference is positive, wherein the second switches are selected as the set of switches if the sign of the voltage difference is negative.

20. The method of claim 17, wherein closing the set of switches one at a time comprises:
   closing a first one of the set of switches that is closest to the third switch;
   after closing the first one of the set of switches, opening the first one of the set of switches; and
   after opening the first one of the set of switches, closing a second one of the set of switches closest to the first one of the set of switches.

* * * * *